(12) United States Patent
Grosso et al.

(10) Patent No.: US 6,473,009 B2
(45) Date of Patent: Oct. 29, 2002

(54) PWM POWER AMPLIFIER

(75) Inventors: Antonio Grosso, Milan; Edoardo Botti, Vigevano, both of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/921,643

(22) Filed: Aug. 3, 2001

(65) Prior Publication Data

US 2002/0036579 A1 Mar. 28, 2002

(30) Foreign Application Priority Data

Aug. 4, 2000 (EP) .......................................... 00830560

(51) Int. Cl.[7] .............................................. H03M 7/20
(52) U.S. Cl. ..................... 341/102; 341/144; 341/152; 341/172; 341/143; 330/250; 330/251; 330/252; 330/262; 330/10; 375/238; 375/242
(58) Field of Search ................................ 341/144, 152, 341/172, 102; 330/250, 251, 252, 262; 375/238, 242

(56) References Cited

U.S. PATENT DOCUMENTS

| | | | | |
|---|---|---|---|---|
| 4,115,738 A | * | 9/1978 | Mitarai et al. ............... | 375/328 |
| 4,924,223 A | * | 5/1990 | Okamoto ..................... | 341/102 |
| 5,073,776 A | * | 12/1991 | Shigemori ................... | 341/102 |
| 5,206,646 A | * | 4/1993 | Sako et al. .................. | 341/102 |
| 5,594,386 A | * | 1/1997 | Dhuyvetter ................. | 330/251 |
| 5,629,997 A | * | 5/1997 | Hardy, Jr. ................... | 385/146 |
| 6,016,075 A | * | 1/2000 | Hamo ......................... | 330/10 |
| 6,066,988 A | | 5/2000 | Igura ........................... | 331/18 |
| 6,208,216 B1 | * | 3/2001 | Nasila ......................... | 332/110 |
| 6,297,692 B1 | * | 10/2001 | Nielsen ....................... | 330/10 |
| 6,307,431 B1 | * | 10/2001 | Botti et al. ................... | 330/10 |
| 6,346,852 B1 | * | 2/2002 | Masini et al. ................ | 330/10 |
| 6,373,417 B1 | * | 4/2002 | Melanson .................... | 341/143 |

FOREIGN PATENT DOCUMENTS

| | | |
|---|---|---|
| EP | 0457496 A2 | 5/1991 |
| EP | 0711036 A2 | 10/1995 |
| WO | 00/35095 | 6/2000 |

* cited by examiner

*Primary Examiner*—Michael Tokar
*Assistant Examiner*—Lam T. Mai
(74) *Attorney, Agent, or Firm*—Lisa K. Jorgenson; E. Russell Tarleton; Seed IP Law Group PLLC (57) ABSTRACT

A PWM power amplifier having at least one PCM/PWM converter fed by PCM digital input signals and producing PWM digital output signals, and at least one power amplification final stage of the PWM digital output signals. At least one PCM/PWM converter includes a counter fed with at least one clock signal produced by a clock generator device and having a digital comparator suitable for comparing the PCM digital input signals of at least one PCM/PWM converter with a digital comparison signal produced by the counter and producing in output the PWM digital signals. The clock generator device includes a pulse generator device and an oscillator; the pulse generator device receives a signal at a frequency that is equal to the frequency of the PCM digital input signals of the at least one PCM/PWM converter and produces in output reset pulses. The reset pulses are sent in input to the oscillator, which produces in output the at least one clock signal.

19 Claims, 10 Drawing Sheets

Fig. 13

PWM POWER AMPLIFIER

BACKGROUND OF THE INVENTION

1. Field of the Invention

The present invention pertains to a PWM power amplifier, and more specifically to a digital input PWM power amplifier.

2. Description of the Related Art

The general trend to reduce energy consumption and the weight and overall dimension represented by heatsinks has stimulated the request of equipment manufacturers for audio power amplifiers with greater efficiency than "AB" class amplifiers.

To meet these requests audio amplifiers in class D have been proposed which comprises a DC-AC converter circuit which produces a pulse width modulated (PWM) output signal; said PWM signal in turn drives power switches which drive a load provided with a passive filter for the reconstruction of the amplified audio signal.

A single output amplifier with analogue input and PWM output (class-D amplifier) is described in the article "Analysis of a quality class-D amplifier," F.A. Himmelstoss, et al., I.E.E.E. Transactions on Consumer Electronics, Vol. 42, No. 3, August 1996.

Widening interest in the digital processing of signals has lead to the manufacture of power amplifiers with digital input instead of analogue input. Digital input power amplifiers include PCM/PWM converters capable of converting a pulse code modulation (PCM) digital signal into a PWM digital signal, and a final stage of power amplification receiving the PWM digital signal and generating an amplified PWM analogue output signal that drives a load provided with a passive filter for the reconstruction of the amplified audio signal. The PCM/PWM converter comprises a counter fed by a clock signal and generating digital comparison words and a digital comparator receiving the digital comparison words through a first input and the PCM digital signal through a second input and producing a digital PWM signal in output.

In a power amplifier of the above type, the device for generating the clock signal needed for the PCM/PWM conversion of the digital signal in input is typically made up of a PLL clock generator (phase locked) which, in per se known way, consists of a loop structure comprising a phase comparator, a filter, a voltage controlled oscillator, and a frequency divider.

A PLL clock generator nevertheless presents a complex structure and is affected by various types of noise above all in virtue of the presence of the phase comparator.

BRIEF SUMMARY OF THE INVENTION

In view of the state of the technique described, the present invention provides a PWM power amplifier provided with a clock generator that at least partially eliminates the above mentioned inconveniences.

In accordance with the disclosed embodiments of the present invention, a PWM power amplifier is provided that has at least one PCM/PWM converter that is fed with PCM digital input signals and produces PWM digital output signals, and at least one final stage of power amplification of the PWM digital signals in output from the at least one PCM/PWM converter. The at least one PCM/PWM converter includes a counter fed with at least one clock signal produced by a clock generator device and having a digital comparator suitable for comparing the PCM digital input signals of the at least one PCM/PWM converter with a digital comparison signal produced by the counter and producing the PWM digital signals in output. The clock generator device includes a pulse generator device and an oscillator, the pulse generator device receiving a signal at a frequency that is equal to the frequency of the PCM digital input signals of the at least one PCM/PWM converter and producing reset pulses in output, the reset pulses being sent in input to the oscillator producing the at least one clock signal in output.

Because of the present invention a PWM power amplifier can be produced that is provided with a clock generator having a simpler circuit than the known clock generator devices and that is less effected by noise in comparison with the same known devices.

BRIEF DESCRIPTION OF THE DRAWINGS

The characteristics and advantages of the embodiments of the present invention will appear evident from the following detailed description of embodiments thereof, illustrated as non-limiting examples in the enclosed drawings, in which.

DETAILED DESCRIPTION OF THE INVENTION

Figure 1:
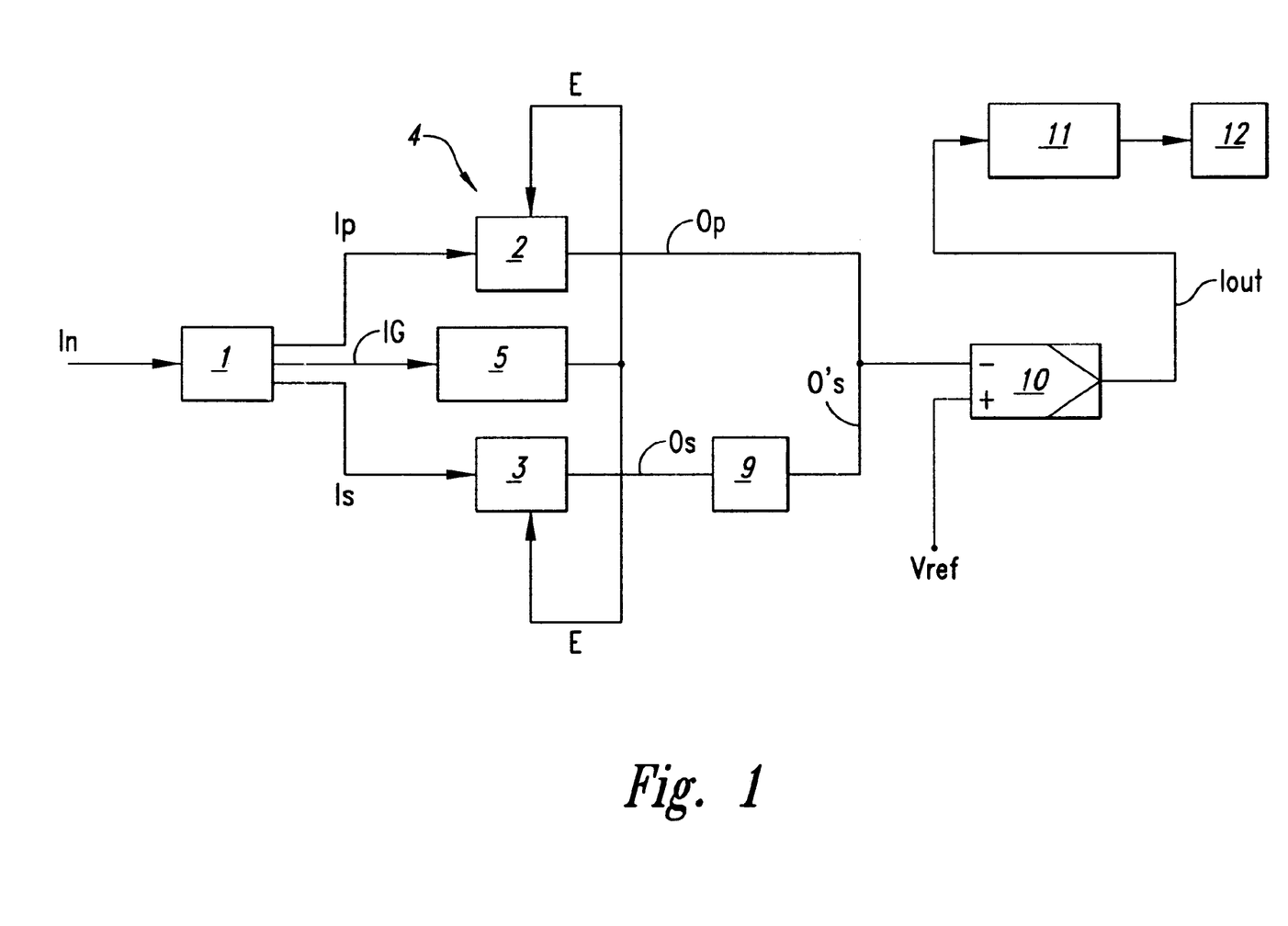
FIG. 1 is a block diagram of the basic structure of the PWM power amplifier according to a first embodiment of the present invention.

With reference to FIG. 1 a power amplifier according to a first embodiment of the present invention is shown, in which initially a digital signal In with pulse code modulation (PCM) with a number M of bits at bit frequency Fin is sent in input to a block 1, where it is converted with oversampling techniques and noise shaping into a digital signal with a number N of bits lower than the number of bits of the digital signal In (M>N) and with a multiple bit frequency, Fin*k, compared to the bit frequency Fin of the digital signal In.

The N bits that compose the signal in output from the block 1 of oversampling and noise shaping are subdivided into two distinct buses, a first bus that transmits a first number P of more significant bits (MSB) and a second bus transmitting a number S of less significant bits (LSB), so as to form respective digital signals Ip and Is at the frequency Fin*k.

The digital signals Ip and Is are sent in input to two PCM/PWM converters, respectively the digital signal Ip is in input to the PCM/PWM converter 2 while the digital signal Is is in input to the PCM/PWM converter 3. The PCM/PWM converters 2 and 3 are part of a block 4 of conversion of digital data at pulse code modulation (PCM) into digital data at pulse width modulation (PWM) which also comprises a clock generator 5 suitable for producing a signal E at clock frequency Fclock necessary for the PCM/PWM conversion of the digital data.

The subdivision of the bits of the N bit digital signals into which the PCM digital signals in input In at M bit are reorganized, enables the use of not exceedingly high clock frequencies Fclock in the block 4. In fact, transforming a PCM signal at 16 bits at 44.1 kHz into a PWM signal without a noticeable deterioration of the signal/noise ratio would require a sampling clock equal to $44100*2^{16}=2.8$ GHz, which is a value that would not be acceptable for the present integrated circuits.

Another problem overcome by the subdivision consists in the fact that the commutation frequency of the PWM signal in output, which in the example taken into consideration is 44.1 kHz, would be too close to the maximum frequency to reproduce (generally in an audio system at about 20 kHz), causing problems of harmonic distortion, frequency linearity and signal residues at commutation frequency downstream from the low-pass reconstruction filter.

If a commutation frequency of the PWM signal is required far enough from the audio band and considering the fact that normally the commutation frequency of the PWM amplifiers is between 100 kHz and 500 kHz, for example in the case considered about 44100*8=352.8 kHz, and opting for a number of more significant bits (MSB) P=6 and a number of less significant bits (LSB) S=6, the clock frequency Fclock will be $352800*2^6=22.57$ MHz, which can be handled with the present technologies used for the manufacture of integrated circuits.

Figure 2:
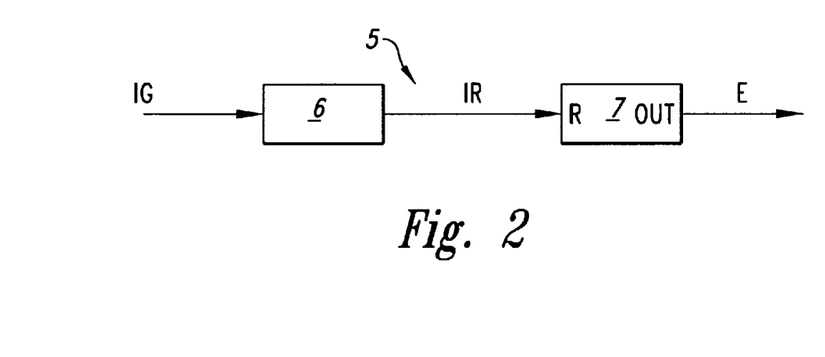
FIG. 2 is a block diagram of the clock generator of the power amplifier in FIG. 1.

The clock generator 5 comprises a reset pulse generator 6 and an oscillator 7, as can be seen in FIG. 2. The reset pulse generator 6, which can be formed for example by a one-shot multivibrator, has a square wave IG input signal at frequency Fin*k, and generates an IR pulse output signal where the pulses are generated at each variation of the IG signal, as can be seen FIG. 3. The signal IR is sent to an input R of the oscillator 7 which produces in output (OUT) the required clock signal E at frequency Fclock.

Figure 3:
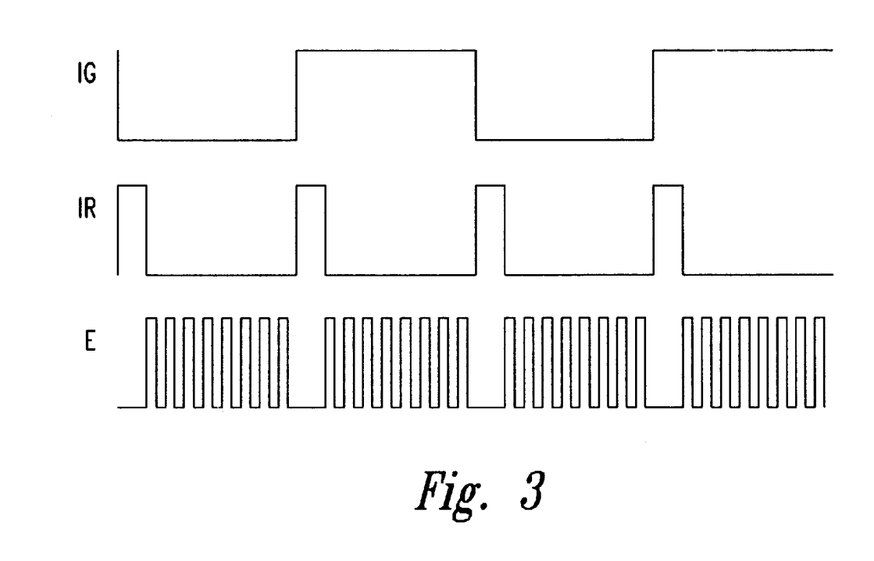
FIG. 3 shows the waveforms of the clock generator in FIG. 2.
Figure 4:
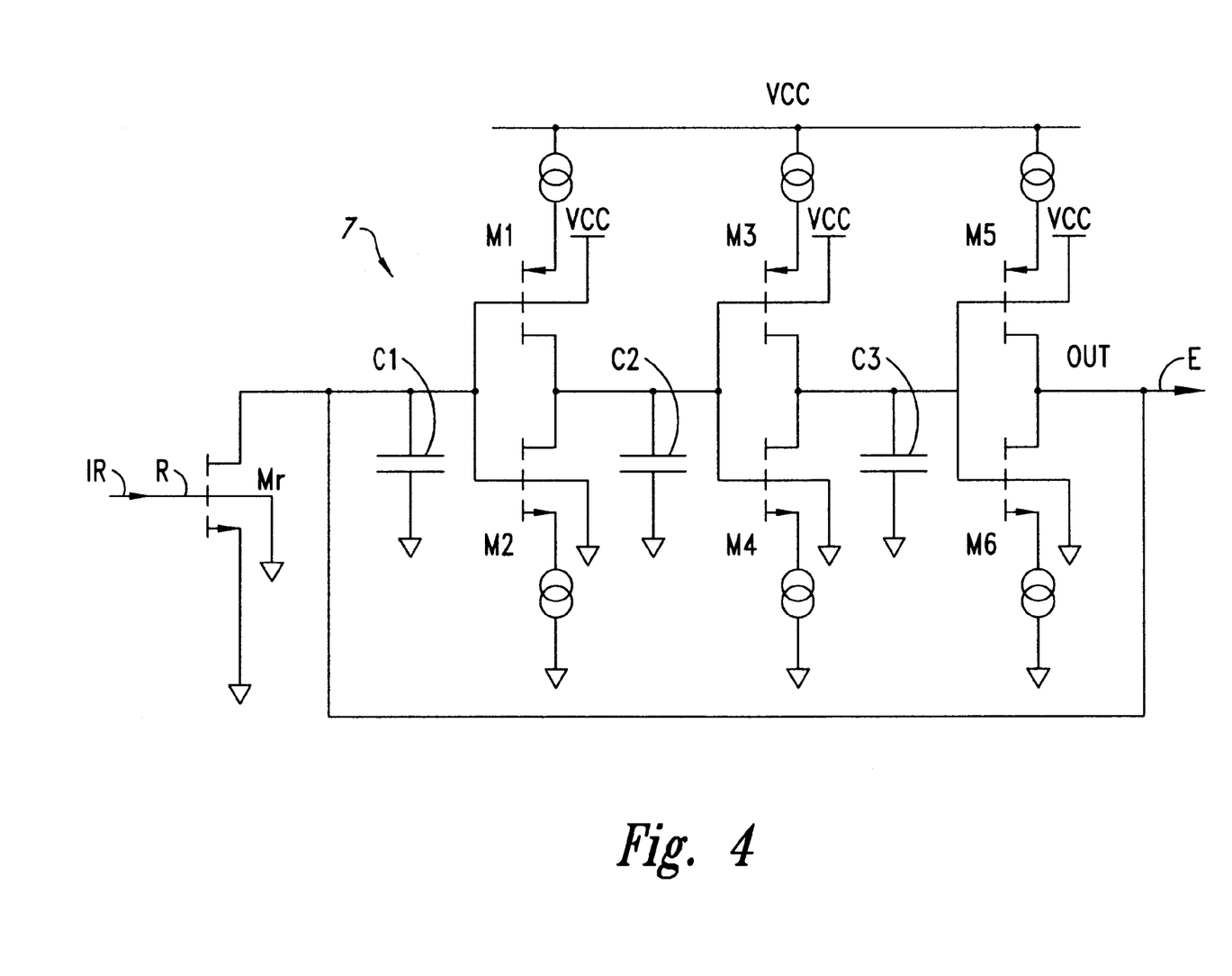
FIG. 4 is a circuit diagram of the oscillator of the clock generator in FIG. 2.

In FIG. 4 a possible implementation of the oscillator 7 is shown. The input R of the oscillator 7 is placed on the gate terminal of a MOS transistor Mr which has the source grounded and the drain connected to a terminal of a capacitor C1 having the other terminal grounded, to the gate terminals of the MOS transistors M1, M2 being part of a first inverter, to the output OUT of the oscillator 7. The transistors M1, M2 have the source terminals connected to suitable current generators and the drain terminals connected to a terminal of a capacitor C2 which has the other terminal grounded and connected to the gate terminals of two MOS transistors M3, M4 being part of a second inverter. The transistors M3, M4 have the source terminals connected to suitable current generators and the drain terminals connected to a terminal of a capacitor C3 which has the other terminal grounded and connected to the gate terminals of two MOS transistors M5, M6 being part of a third inverter. The transistors M5, M6 have the source terminals connected to suitable current generators and the drain terminals connected to the output OUT. The bulk terminals of the transistors Mr, M2, M4, M6 are grounded while the bulk terminals of the transistors M1, M3, M5 are connected to a voltage supply Vcc. The transistor Mr brings the clock signal E at frequency Fclock to a low value when an impulse IR is present on its gate terminal, as can be seen in FIG. 3; in this manner the oscillator 7 can be reset.

Figure 5:
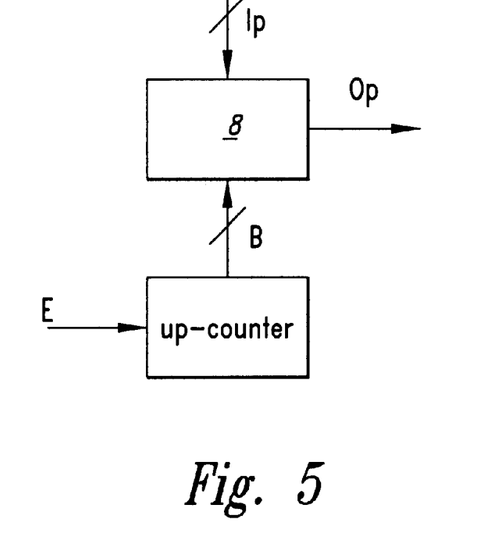
FIG. 5 is a diagram of the internal structure of each of the two PCM/PWM single ramp converters in FIG. 1.
Figure 6:
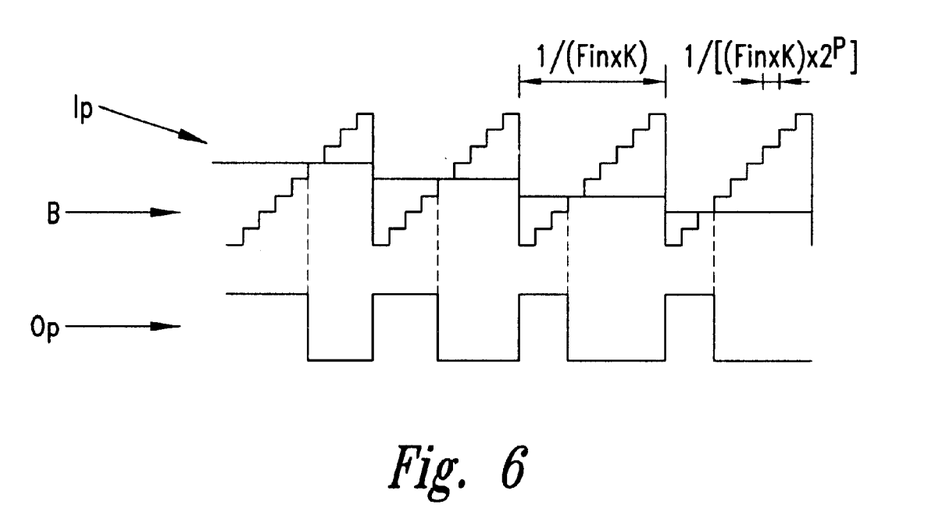
FIG. 6 shows the operating waveforms of a PCM/PWM single ramp converter.

The functional block diagram and the functional waveforms valid for each of the two PCM/PWM converters 2 and 3 used in the PWM power amplifier in FIG. 1 are shown in FIGS. 5 and 6; for simplicity only the PCM/PWM converter 2 will be described hereinafter.

The PCM/PWM converter 2 is of the single ramp B type obtained by means of an up-counter, cyclic or resettable, powered by the clock signal E at frequency Fclock=(Fin*k) $*2^P$, that is equal to the product of the frequency of the signal Ip in input to the converter 2 by the power in base two of the number of bits P which form the signal Ip; the clock signal E is obtained by means of the clock generator 5 previously described. The ramp B signal is compared with the PCM digital signal Ip by a digital comparator 8; the result of the comparison is the PWM digital signal Op in output from the converter 2 whose duty-cycle is function of the MSB input data and whose frequency is Fin*k. In the same manner the PWM digital signal Os in output from the converter 3 will have a duty-cycle which depends on the LSB input data and whose frequency is Fin*k.

The PWM digital signal Os in output from the converter 3 is attenuated in the block 9 by a ratio equivalent to the power in base two of the number S of bits transmitted to the input of the same converter thereby obtaining a signal O's=Os/($2^S$). The signals Op and O's are summed at the inverting node of a power amplification final block 10 (the output stage of the PWM power amplifier) which is the power amplification module functioning in class D described and illustrated in the European patent application No. 1001526. A reference voltage Vref is connected to the non-inverting node of the block 10.

The PWM digital signal Op produced by the PCM/PWM converter 2 drives the output stage 10 determining its commutation frequency. The PWM digital signal O's drives the block 10 with a weight reduced by $1/2^S$; in this manner the signal O's modulates the PWM signal Iout in output from block 10 correcting its non-linearity and attenuating the noise introduced by the quantization to a reduced number P of bits of the PWM digital signal Op.

The amplified PWM signal Iout is sent in input to a low-pass filter 11 which provides for the reconstruction of the starting audio signal; the signal in output from filter 11 will be sent to a load 12 made up for example by a loudspeaker.

Hereinafter other embodiments of the present invention will be described in which the elements equal to the first or to other embodiments will have the same references.

Figure 7:
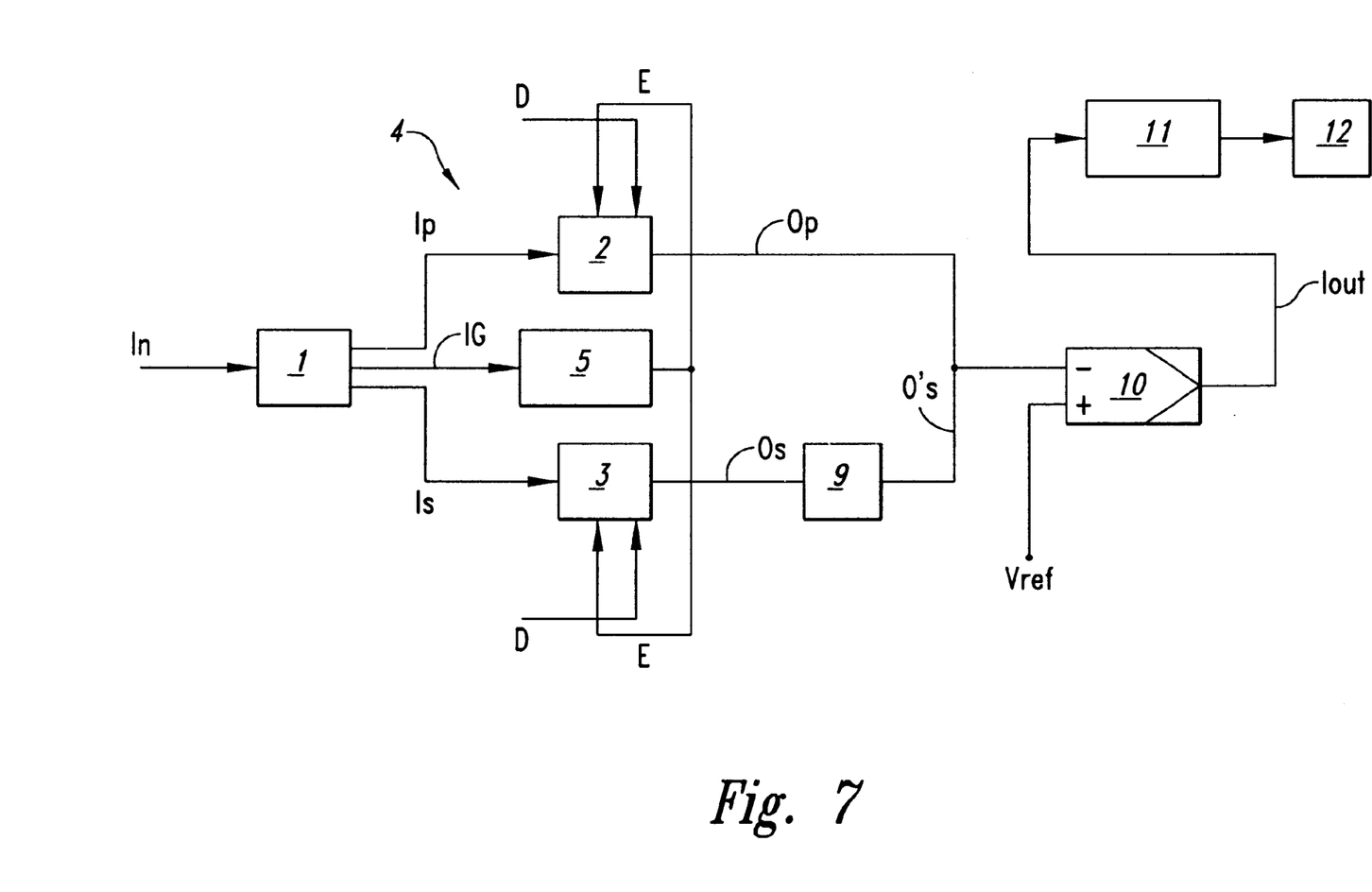
FIG. 7 is a block diagram of the basic structure of a power amplifier according to a second embodiment of the invention characterized by the use of PCM/PWM double ramp converters.
Figure 8:
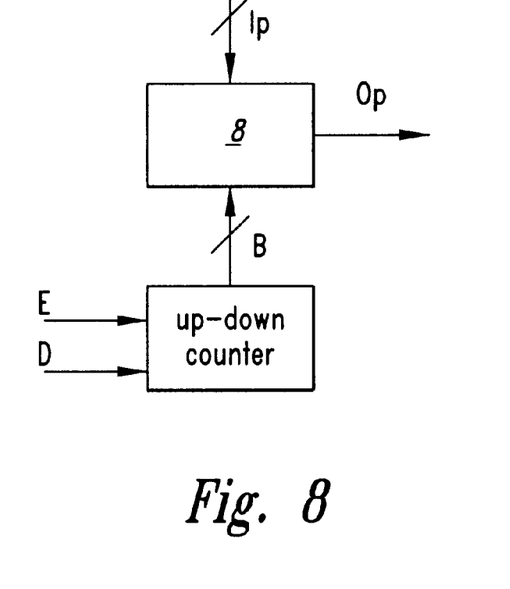
FIG. 8 shows the internal structure of a PCM/PWM double ramp converter.
Figure 9:
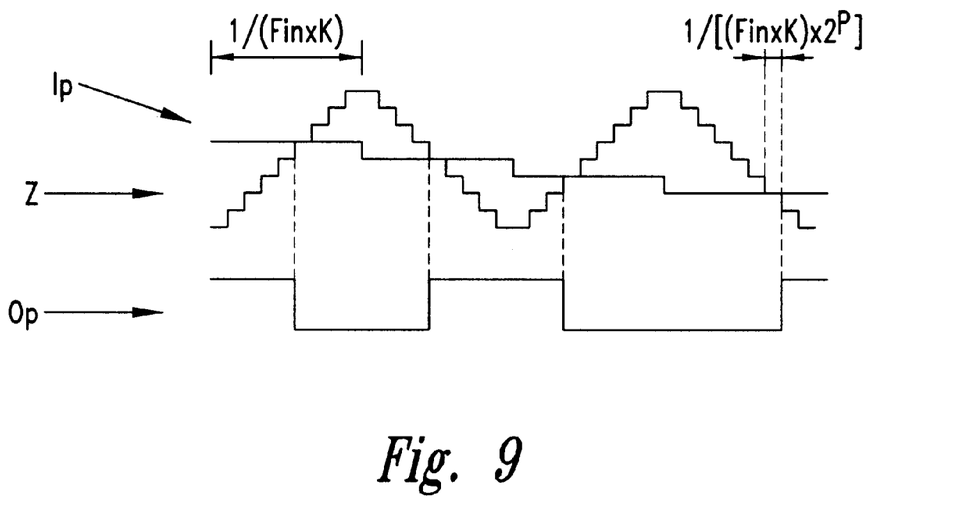
FIG. 9 shows the operating waveforms of the PCM/PWM double ramp converter in FIG. 8.

In FIGS. 7–9 a PWM power amplifier according to a second embodiment is described which differs from the first embodiment in the use of the PCM/PWM double ramp converters instead of single ramp converters; in this manner the frequency of the PWM signals produced in output from the two PCM/PWM 2 and 3 converters is halved compared to the Fin*k frequency of the digital signals Ip an Is in input to the converters 2 and 3.

The functional block diagram and the functional waveforms valid for each of the two PCM/PWM double ramp converters 2 and 3 used in the PWM power amplifier in FIG. 1 are shown in FIGS. 8 and 9; for simplification only the PCM/PWM converter 2 will be described hereinafter.

Said PCM/PWM converter 2 is of the double ramp Z type obtained by means of an up-down counter, cyclic or resettable, powered both with the signal of clock E at frequency Fclock=(Fin*k)*$2^P$, that is equal to the product of the frequency of the signal Ip in input to the converter 2 by the power in base two of the number of bits P that form the signal Ip (the clock signal E is obtained by means of the clock generator 5 previously described), and with a second clock signal D at frequency Fup/down (produced by a clock generator different from generator 5) with the frequency Fup/down=Fin*k which synchronizes the ramp inversions. The double ramp signal Z is compared with the PCM digital signal Ip by a digital comparator 8; the result of the comparison is the PWM digital signal Op in output from converter 2 whose duty-cycle is function of the MSB input data and whose frequency is Fin*k/2. In the same manner the PWM digital signal Os in output from converter 3 will have a duty-cycle which depends on the LSB input data and whose frequency is Fin*k/2.

The PWM digital signal Os in output from converter 3 is attenuated in block 9 in a ratio equivalent to the power in base two of the number S of bits transmitted to the input of the sane converter obtaining a signal O's=Os/($2^s$). The signals Op and O's are summed at the inverting node of the power amplification final block 10.

The double ramp converters enable the performance of the amplifier to be improved from the point of view of the signal/noise ratio and of the distortion compared to the use of single ramp converters.

Figure 10:
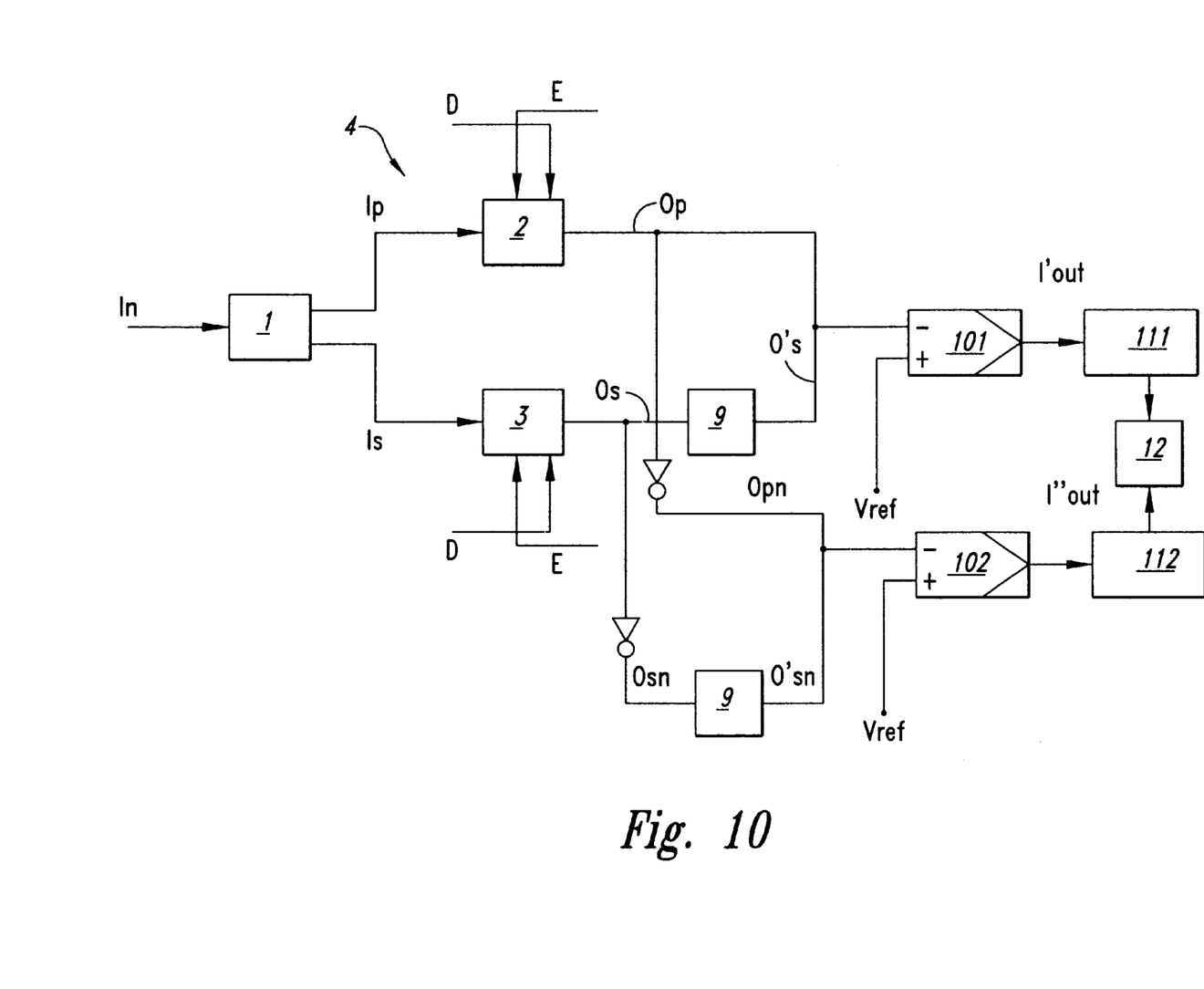
FIG. 10 is a block diagram of the basic structure of a power amplifier according to a third embodiment of the invention.

The block diagram of a PWM power amplifier according to a third embodiment of the invention is shown in FIG. 10, differing from the second embodiment previously described only in the presence of an output which is no longer single but of bridge type, using two push-pull driven output stages 101 and 102 (with relative low-pass filters 111 and 112). The signals Op and O's are summed at the inverting node of the first output stage 101 while the signals Opn and O'sn (the signal O'sn is the signal Osn attenuated by block 9), which are respectively signals Op and O's negated, are summed at the inverting node of the output second stage 102. The output signals of the two stages 101 and 102 I'out and I"out are sent to the respective low-pass filters 111 and 112 and the output signals of the filters drive the load 12.

Figure 11:
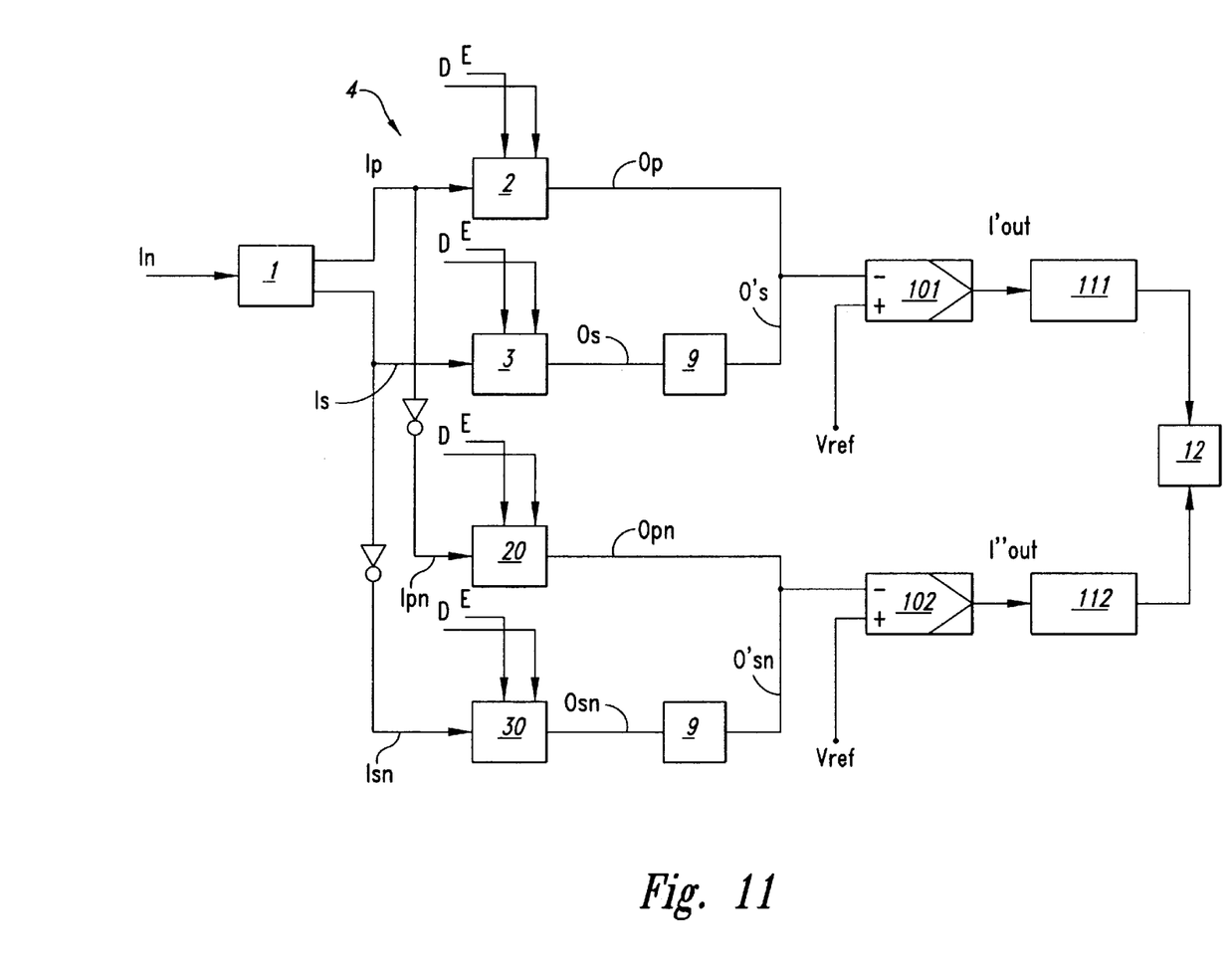
FIG. 11 is a block diagram of the basic structure of a power amplifier according to a fourth embodiment of the invention.

FIG. 11 shows the block diagram of a PWM power amplifier according to a fourth embodiment of the invention which differentiates from the third embodiment previously described in that it provides for a double ramp conversion both for the signals Ip and Is and for the signals Ipn and Isn, which are the signals Ip and Is negated, by means of further double ramp PCM/PWM converters 20 and 30, similar to the converters 2 and 3, which supply in output the signals Opn and Osn. In said case the output of the PWM power amplifier is of the phase shift bridge type and presents a more complex architecture than that in FIG. 10 but is capable of giving higher performance, as is described in detail and illustrated in the European patent application No. 1001526.

Figure 12:
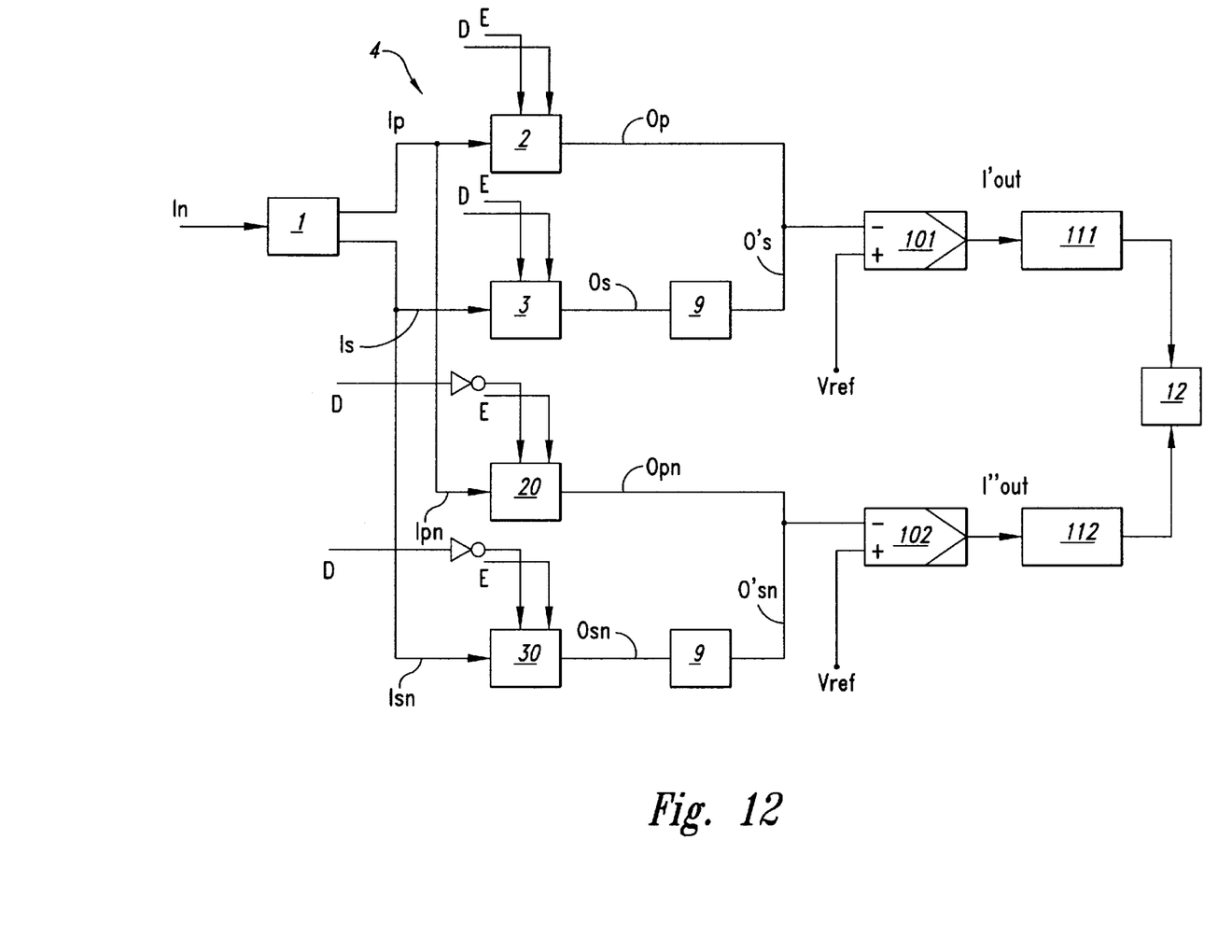
FIG. 12 is a block diagram of the basic structure of a power amplifier according to a fifth embodiment of the invention.

FIG. 12 shows the block diagram of a PWM power amplifier according to a fifth embodiment of the invention which differentiates from the fourth embodiment previously described in that the signals Opn and Osn in output from the PCM/PWM converters 20 and 30 derive not from inverted digital signals Ipn and Isn but by inverting the clock signal D at frequency Fup/down of the up-down counters of the converters 20 and 30, such as to generate triangular signals in counter-phase between each other.

Figure 13:
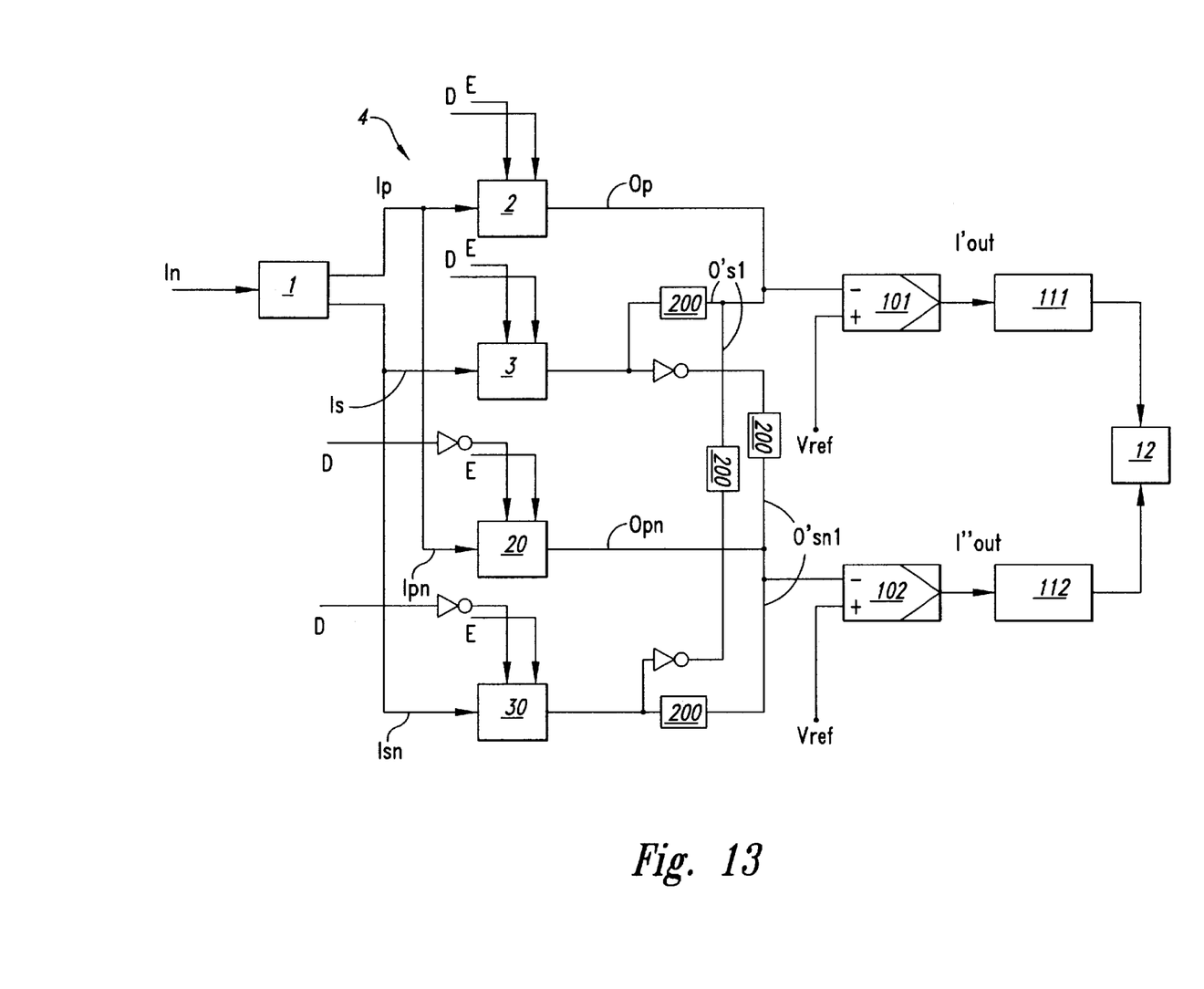
FIG. 13 is a block diagram of the basic structure of a power amplifier according to a sixth embodiment of the invention.

FIG. 13 shows the block diagram of a PWM power amplifier according to a sixth embodiment of the invention which differentiates from the fifth embodiment previously described because the PWM digital signals Op and Opn are summed to twice the respective signals O's1 and O'sn1 which are the signals O's and O'sn at double frequency compared to the frequency of the signals Op and Opn, at the respective inverting nodes of the two output stages 101 and 102.

The advantages of said embodiment lie both in the fact that the correction signal (relative to the signals Os and Osn) can be added, subtracted or can also not influence the main drive signal (relative to the signals Op and Opn), and in the fact that the correction signal does not contain tones at PWM commutation frequency or in its proximity (the tones of a band of 20 kHz around a commutation frequency are returned to base band causing an increase in distortion or noise).

In the embodiments illustrated in the Figures the blocks 9 and 200 can be constituted by simple resistors or by current generators controlled by the output logic signal of the respective PCM/PWM converters.

The frequency of the oscillator 7 of the clock generator 5 can be varied by continuously changing its characteristics; the consequence is a continuous variation of the width of the output signal of the PWM amplifier due to the variable gain of the PCM/PWM conversion block 4.

In all the embodiments previously described the clock signal E at frequency Fclock is produced by the generator 5 of FIG. 2.

From the foregoing it will be appreciated that, although specific embodiments of the invention have been described herein for purposes of illustration, various modifications may be made without deviating from the spirit and scope of the invention. Accordingly, the invention is not limited except as by the appended claims and the equivalents thereof.

What is claimed is:

1. A PWM power amplifier, comprising: at least one PCM/PWM converter which is fed by PCM digital input signals and produces PWM digital output signals, and at least one final stage of power amplification of the PWM digital signals in output from said at least one PCM/PWM converter, said at least one PCM/PWM converter comprising a counter fed with at least one clock signal produced by a clock generator device and comprising a digital comparator suitable for comparing said PCM digital input signals of said at least one PCM/PWM converter with a digital comparison signal produced by said counter and producing in output said PWM digital signals, said clock generator device comprising a pulse generator device and an oscillator, said pulse generator device receiving a signal at a frequency equal to the frequency of said PCM digital input signals of said at least one PCM/PWM converter and producing in output reset pulses, said reset pulses being sent in input to said oscillator producing in output said at least one clock signal.

2. The amplifier of claim 1, comprising an oversampling and noise shaping block receiving first PCM digital input signals organized in words with a given number of bits and at a given frequency and producing in output second PCM digital signals organized in words composed of a number of bits lower than said given number of bits and at a multiple frequency with respect to said given frequency of the first PCM digital input signals, said second PCM digital signals being the PCM digital signals in input to said at least one PCM/PWM converter.

3. The amplifier of claim 2, comprising a first bus suitable for transmitting first digital data PCM containing a first number of more significant bits of said second PCM digital signals and a second bus suitable for transmitting second PCM digital data containing a second number of less significant bits of said second PCM digital signals, and comprising a first and a second PCM/PWM converter fed respectively by said first and second PCM digital data and producing in output respectively a first and a second PWM signal.

4. The amplifier of claim 3 wherein said second signal PWM is previously attenuated by a ratio equivalent to the power in base two of the second number of less significant bits transmitted by said second bus to the input of said second PCM/PWM converter and is summed to said first signal PWM at an inverting node of said at least one power amplification final stage of the amplifier.

5. The amplifier of claim 1 wherein said at least one clock generator produces a clock signal whose frequency equals the product of the frequency of the bits of the PCM digital signals in input to said at least one PCM/PWM converter by the power in base two of the number of bits of said PCM digital signals in input to at least one PCM/PWM converter, said counter fed by said at least one clock signal generating a digital comparison output signal composed of said number of bits in the form of at least one ramp of digital values at an identical or halved frequency compared to said frequency of bits of the PCM digital signals in input to the at least one PCM/PWM converter.

6. The amplifier of claim 5 wherein said digital comparison signal of said at least one PCM/PWM converter is in the form of a succession of upward ramps of digital values at a frequency identical to said frequency of bits of the PCM digital signals in input to at least one PCM/PWM converter.

7. The amplifier of claim 5 wherein said at least one PCM/PWM converter is a double ramp type, said counter being of the up/down type, having in input a ramp inversion signal and generating in output a digital comparison signal composed by the number of bits of said PCM digital signals in input to at least one PCM/PWM converter under the form of a succession of up and down ramps at a halved frequency compared to the frequency of the PCM digital signals in input to said at least one PCM/PWM converter.

8. The amplifier of claim 1, comprising a single power amplification final stage.

9. The amplifier of claim 1, comprising two identical power amplification final stages functioning in counterphase and in which the inversion of the signal fed to the inverting input of said two final stages is made by inverting the PWM digital signal in output from said at least one PCM/PWM converter.

10. The amplifier of claim 1, comprising two identical power amplification final stages functioning in counterphase and in which the inversion of the signal fed to the inverting input of said two final stages is made by duplicating said at least one PCM/PWM converter and inverting the PCM digital signals in input to said at least two PCM/PWM converters.

11. The amplifier of claim 1 wherein said clock generator produces a clock signal whose frequency equals the product of the frequency of the bits of the PCM digital signals in input to said at least one PCM/PWM converter by the power in base two of the number of bits of said PCM digital signals in input to at least one PCM/PWM converter, said at least one PCM/PWM converter is a double ramp type, said counter being fed by said clock signal and being the up/down type, having in input a ramp inversion signal and generating in output a digital comparison signal composed of the number of bits of said PCM digital signals in input to at least one PCM/PWM converter in the form of a succession of up and down ramps at a halved frequency compared to the frequency of the PCM digital signals in input to said at least one PCM/PWM converter, and comprising two identical power amplification final stages functioning in counterphase and in which the inversion of the signal fed to the inverting input of said two final stages is made by duplicating said at least one PCM/PWM double ramp converter and inverting the ramp inversion signal of said at least one PCM/PWM converter and feeding both said at least one PCM/PWM converter and its duplicate with the same PCM input digital signals.

12. The amplifier of claim 4 wherein said at least one clock generator produces a clock signal whose frequency equals the product of the frequency of the bits of the PCM digital signals in input to said at least one PCM/PWM converter by the power in base two of the number of bits of said PCM digital signals in input to at least one PCM/PWM converter, said at least one PCM/PWM converter being double ramp type, said counter being fed by said clock signal and being the up/down type, having in input a ramp inversion signal and generating in output a digital comparison signal composed of the number of bits of said PCM digital signals in input to at least one PCM/PWM converter in the form of a succession of up and down ramps at a halved frequency compared to the frequency of the PCM digital signals in input to said at least one PCM/PWM converter; and comprising two identical power amplification final stages functioning in counterphase and in which the inversion of the signal fed to the inverting input of said two final stages is made by duplicating said couple of PCM/PWM double ramp converters and inverting the signal of ramp inversion of said couple of PCM/PWM converters and feeding both said couple of PCM/PWM converters and their duplicate with the same PCM digital signals of said first bus and of said second bus.

13. The amplifier of claim 12, comprising means for inverting the PWM signals produced at the output of the PCM/PWM converters of said couple and its duplicate which are fed with said PCM digital signals containing the less significant bits, means for attenuating the inverted PWM signals and means for summing each of said PWM signals inverted and attenuated on the inverting node on which the PWM signals produced by the PCM/PWM converters belonging to the other one between said couple of converters or its duplicate are summed.

14. The amplifier of claim 1 wherein said oscillator comprises inverters each formed by a couple of MOS transistors and placed in series and in a loop so that the input of the first of said inverters is connected with the output of the last of said inverters, capacities in a number equal to that of the inverters and each one having a terminal connected to a respective input of each inverter and the other terminal grounded, a transistor MOS having in input said reset pulses and the output connected to the input of said first inverter.

15. A PWM power amplifier, comprising:
a digital signal circuit configured to receive in input a PCM signal with M bits and to convert the PCM signal with oversampling and noise shaping techniques into a PCM digital signal having N bits, where M>N;
first and second PCM/PWM converters coupled to the digital signal circuit, the converters comprising a counter and a comparator, the counter configured to receive a clock signal and to generate a digital comparison signal, and the comparator configured to receive the digital comparison signal and at least a portion of the PCM digital signal and to generate first and second PWM digital signals as output of the first and second PCM/PWM converters, respectively;
a clock generator circuit comprising a pulse generator device and an oscillator, the pulse generator device receiving a signal at a frequency equal to a frequency of the PCM signal and to generate output reset pulses, and an oscillator configured to receive the output reset pulses and to generate the clock signal; and
a final stage configured to receive a combination of the first and second PWM digital signals and to provide power amplification thereof in an output.

16. The amplifier of claim 15, wherein the digital signal circuit comprises an oversampling and noise shaping block configured to receive the PCM signal in words with a predetermined number of M bits at an input frequency and to generate the PCM digital signal organized in words composed of N number of bits at a second frequency that is a multiple of the first frequency.

17. The amplifier of claim 16, wherein the second PWM digital signal output by the second PCM/PWM converter is attenuated by a ratio equivalent to the power in base two of the number of bits in the portion of the PCM digital signal received by the second PCM/PWM converter, and wherein the first and second PWM digital signals are summed at an input of the final stage.

18. A PWM power amplifier, comprising:
a digital signal circuit configured to receive in input a PCM signal with M bits and to convert the PCM signal with oversampling and noise shaping techniques into a PCM digital signal having N bits, where M>N;
first and second PCM/PWM converters coupled to the digital signal circuit, the converters comprising a counter and a comparator, the counter configured to receive a clock signal and to generate a digital comparison signal, and the comparator configured to receive the digital comparison signal and at least a portion of the PCM digital signal and to generate first and second PWM digital signals as output of the first and second PCM/PWM converters, respectively;
a clock generator circuit comprising a pulse generator device and an oscillator, the pulse generator device receiving a signal at a frequency equal to a frequency of the PCM signal and to generate output reset pulses, and an oscillator configured to receive the output reset pulses and to generate the clock signal, the clock signal having a clock frequency equal to the product of the first frequency by the power in base two of the number of bits of the PCM signal portion input into one of the first and second PCM/PWM converters, the counter receiving the clock signal and configured to generate the digital comparison output signal in the form of at least one ramp of digital values at an identical or halved frequency compared to the first frequency; and
a final stage configured to receive a combination of the first and second PWM digital signals and to provide power amplification thereof in an output.

19. A PWM power amplifier, comprising:
a digital signal circuit configured to receive in input a PCM signal with M bits and to convert the PCM signal with oversampling and noise shaping techniques into a PCM digital signal having N bits, where M>N;
first and second PCM/PWM converters coupled to the digital signal circuit, the converters comprising a counter and a comparator, the counter configured to receive a clock signal and to generate a digital comparison signal, and the comparator configured to receive the digital comparison signal and at least a portion of the PCM digital signal and to generate first and second PWM digital signals as output of the first and second PCM/PWM converters, respectively;
a clock generator circuit comprising a pulse generator device and an oscillator, the pulse generator device receiving a signal at a first frequency equal to a frequency of the PCM signal and to generate output reset pulses, and an oscillator configured to receive the output reset pulses and to generate the clock signal, the clock signal having a frequency equal to the product of the first frequency by the power in base two of the number of bits of the PCM signal received by one of the first and second PCM/PWM converters, each of the first and second PCM/PWM converters comprising a double ramp type converter receiving the clock signal, and each counter being of the up/down type and having in input a ramp conversion signal and configured to generate in output the digital comparison signal comprising the number of bits of the portion of the PCM signal received by the respective counter, and further in the form of a succession of up and down ramps at a halved frequency of the first frequency; and
a first final stage configured to receive a combination of the first and second PWM digital signals and to provide power amplification thereof in an output, and a second final stage that is a duplicate of the first final stage and functioning in counter phase thereof and having an inversion signal input that receives an inversion of a combination of the PWM digital signals that is generated by a second and third pair of PCM/PWM double ramp converters that are duplicates of the first and second PCM/PWM converters and having the ramp inversion signal inverted and to generate a power amplification thereof.

* * * * *